United States Patent [19]

Sheesley et al.

[11] 3,945,808

[45] Mar. 23, 1976

[54] LEAD FRAME ADAPTED FOR ELECTRICAL SWITCH PACKAGE

[75] Inventors: Wilmer Lee Sheesley, Harrisburg; William Vito Pauza, Palmyra, both of Pa.

[73] Assignee: AMP Incorporated, Harrisburg, Pa.

[22] Filed: May 27, 1975

[21] Appl. No.: 581,400

Related U.S. Application Data

[60] Division of Ser. No. 460,843, April 15, 1974, Pat. No. 3,900,709, which is a continuation-in-part of Ser. No. 454,530, March 25, 1974, abandoned.

[52] U.S. Cl. .................. 29/193.5; 200/5 R; 200/275

[51] Int. Cl.[2] ............................................ H05K 7/18

[58] Field of Search ........... 29/193.5, 193; 200/1 A, 200/5 R, 6 B, 6 BB, 11 R, 18, 275

[56] References Cited

UNITED STATES PATENTS

| | | | |
|---|---|---|---|
| 3,299,224 | 1/1967 | De Lorme et al. | 200/6 B |
| 3,621,157 | 11/1971 | Schwab | 200/6 BB |
| 3,792,206 | 2/1974 | Purdy | 200/6 B |
| 3,808,390 | 4/1974 | Hammell et al. | 200/283 |
| 3,858,012 | 12/1974 | Lockard | 200/16 D |

*Primary Examiner*—R. Dean
*Assistant Examiner*—Arthur J. Steiner
*Attorney, Agent, or Firm*—Allan B. Osborne

[57] ABSTRACT

The present invention discloses a low-profile package containing one or more individually operated switches. More particularly, the present invention consists of an insulating housing having therein one or more single pole - single throw switches all of which have been stamped and formed from a single coplanar sheet of conductive material. The upper portion of the housing contains one or more switch actuators which can be depressed to provide momentary switch closure or rotated to provide continuous switch closure.

2 Claims, 8 Drawing Figures

LEAD FRAME ADAPTED FOR ELECTRICAL SWITCH PACKAGE

CROSS REFERENCE TO RELATED APPLICATION

This application is a divisional application of Ser. No. 460,843, filed Apr. 15, 1974 and now U.S. Pat. No. 3,900,709 which is in turn a continuation-in-part application of Ser. No. 454,530, filed Mar. 25, 1974 and now abandoned.

BACKGROUND OF THE INVENTION

Electrical switch packages having a number of separate switches are finding increasingly wider application particularly as components on printed circuit boards. An example of one such switch package is a binary codable, cam operated switch assembly illustrated in U.S. Pat. No. 3,792,206. The package disclosed therein is ideally suited for use as a coded address system on a printed circuit board.

Another area of use for switch packages exists in garage door operators utilizing limited range receiving transmitting radio systems. In the earlier systems, the frequency on which the system operated was permanently set during assembly. Out of this a somewhat humorous problem developed; i.e., the garage doors mysteriously opening or closing. The cause, of course was quickly determined as being the result of interference from passing cars, operation of near-by garage door systems and the like. However, a more serious problem also developed; i.e., interference with ham radio operations by the garage door systems.

In an effort to avoid such problems, radio systems were equipped with the means to change the frequency. These means included that of re-wiring the frequency-controlling circuits so as to provide a different frequency. This method obviously is time consuming in that after the re-wiring was done it had to be tested to determine whether the new frequency avoided interference. Further, re-wiring is always susceptable to faulty workmanship such that the connections may work loose through vibrations and the like.

To avoid these problems, workers in the field turned to electrical switch packages whereby the frequency could be changed by simply resetting the several switches contained in the package. These overcame the re-wiring problems but the switches introduced other problems. For example, because they contain springs and the like, the packages have a considerable height. The costs of the switches are considerable in that they contained a large number of hand-crafted parts and are hand-assembled. The toggles or push buttons, prominently extending up from the package surface, are susceptable to accidental movement. Yet another problem is that the packages generally are not environmentally sealed, hence dirt, moisture and other debris have free and damaging access to the mechanism and more importantly, to the contacts themselves.

Accordingly it is an object of the present invention to provide an electrical switch package with a minimum number of parts and which can be machine-assembled.

Another object of the present invention is to provide a low-cost electrical switch package having a lowprofile and which is ideally suited for use on printed circuit boards and flat flexible cable.

Still another object of the present invention is to provide an electrical switch package having reliable switch action with no or only a minimum of trouble during a long service life.

Yet another object is to provide an electrical switch package wherein the contact actuators are recessed into the housing to prevent accidental movement thereof.

Another object of the present invention is to provide an environmentally sealed electrical switch package wherein the one or more switches are operated independently and the contacts can be opened or closed momentarily or can be set in either position at the option of the operator.

These and other objects, novel features and advantages of the present invention will be readily apparent from the following detailed description of the preferred embodiment.

DESCRIPTION OF THE FIRST PREFERRED EMBODIMENT

Figure 1:
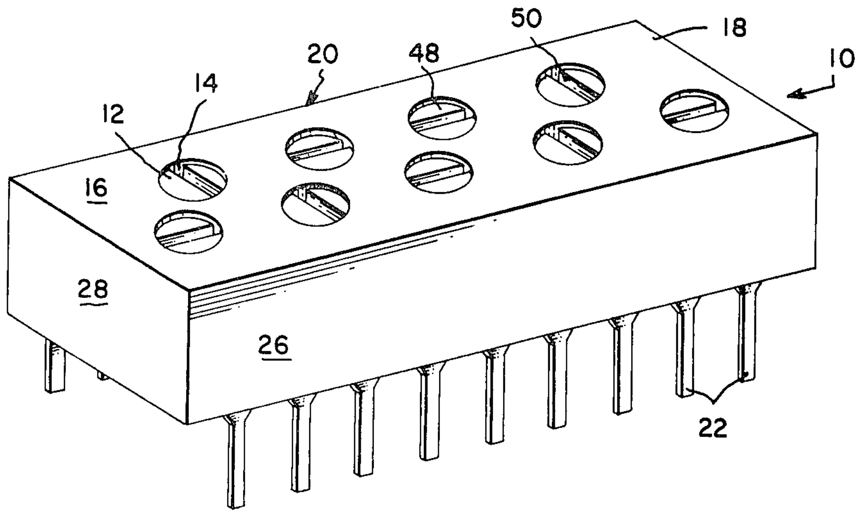
FIG. 1 is a view of the first preferred embodiment constructed in accordance to the present invention.

The electrical switch package 10 shown in FIG. 1 illustrates the clean, unencumbered lines of the package which adapts it so well to closely stacked printed circuit boards or other space confining environments. The Figure also illustrates the recessed contact actuators 12 positioned in apertures 14. The recesses permits a smooth top surface 16 on cover 18. (FIG. 2) of housing 20. The smooth surface lends itself to receiving adhesive tape to protect the contact during the wave soldering of contact member legs 22 to printed circuit board or like receptacles (not shown). Further, tape across the surface of a package in use will bar moisture and dirt from entering the package.

Preferably cover 18 and base 24 (FIG. 2) of housing 20 is molded from a glass filled nylon, a material which provides strength and electrical insulation.

Figure 2:
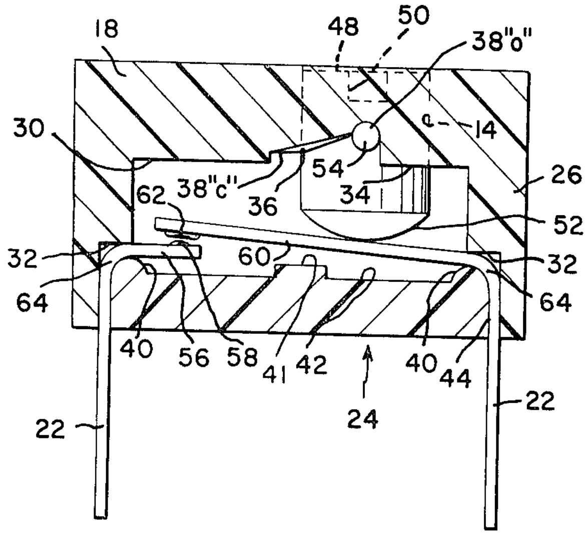
FIG. 2, is a cross-sectional view of the embodiment of FIG. 1.

FIG. 1 shows the contact actuators for nine individual switches, one of which is shown in cross-section in FIG. 2. It is to be understood however that the present invention contemplates a package containing from one up to any number of individual switches.

FIG. 2 shows the structural features of a single switch in package 10.

Cover 18 consists of the top surface 16, side walls 26 and end walls 28 (FIG. 1). Cross-sectionally, cover 18 is U-shaped to provide an interior space in cooperation with base 24. The ceiling is designated by reference numeral 30. The side walls 26 have a change in thickness to define interior, downwardly facing shoulders 32.

The top of the cover is bored through at predetermined locations to provide the aforementioned aperture 14. The lower edge 34 of the aperture; i.e., the circumference of the aperture opening onto ceiling 30, has two diametrically opposed, slanted camming surfaces 36 of which only one is shown. Each camming surface 36 extends around the circumference of the aperture for about 90 degrees; i.e., about 1.57 radians, and at each end terminates in an arcuate depression 38. The depression closest to cover top surface 16 is hereinafter designated by adding the letter *o* to reference numeral 38 and the depression closest to downwardly facing surface 30 is hereinafter designated by adding the letter *c* to reference numeral 38. The slant or angle of the camming surfaces relative to the horizontal is predetermined to provide the proper vertical displacement of contact actuator 12 as it is rotated in aperture 14.

Base 24 of housing 20 is a rectangular block having a constant thickness except for two rounded, upwardly projecting contact support rails 40, one on each longitudinal side of the base and a flat-surfaced longitudinally extending ridge 41 positioned midway between rails 40. The rails 40 define a cavity 42 thereinbetween with ridge 41 bisecting it. The over-all width of the base is slightly less than the width between the thinner portions of side walls 26 and the length is almost equal to the distance between end walls 28 of the cover. The thickness of the base plus the height of the rails is slightly less than the length of the aforementioned thinner portions of side walls 26. Ridge 41, has an important predetermined height as will be discussed below. Both sides of base 24 contain vertical slots 44 which are aligned with aperture 14 and which receive legs 22 of the contact members.

Transverse walls (not shown) may be included between adjacent apertures 14 to define, in conjunction with base 24, completely isolated switch chambers (not shown). However, such isolation is not necessary where the voltage between switches is of non-arcing nature or is low.

Contact actuators 12 are cylindrical bodies having a flat upper surface 48 bisected by a screwdriver-receiving slot 50. The opposite end of the actuator is characterized by a smooth spherical; i.e., dome-shaped, surface, and referred to hereinafter as the lower surface 52.

Two diametrically opposed pins 54, positioned between the two surfaces, project laterally outwardly from the cylindrical portion of actuator 12. As is apparent from FIG. 2, with the actuator positioned in aperture 14, pins 54 seat in one or the other arcuate depression 38 and ride on camming surfaces 36. Preferably the actuators are molded from a polycarbonite compound.

With continuing reference to FIG. 2, a lead frame, stamped and formed from a single coplanar sheet of conductive material such as copper alloy, provides the contacts which are opened and closed via contact actuator 12. Each switch assembly contains two contact members, each member being positioned on an opposite side of base 24 with the free ends extending into chamber 46. The left hand contact member in FIG. 2 contains a short fixed arm 56. An upwardly projecting, transversely extending, elongated dimple 58, located at the arm's free end, provides the contact per se; i.e., that point which will touch a like point on the other contact member to enable an electrical current to flow from one circuit to another circuit through the opposing contact members. Although this arm is designated as a "fixed" arm, it may move slightly when engaged by the opposite contact member.

The right hand contact member in FIG. 2 contains a long movable arm 60. A downwardly projecting, longitudinally extending, elongated dimple 62 located at that arm's free end and in overlying relation to the aforementioned fixed arm contact, provides the contact per se for that contact member.

Figure 3:
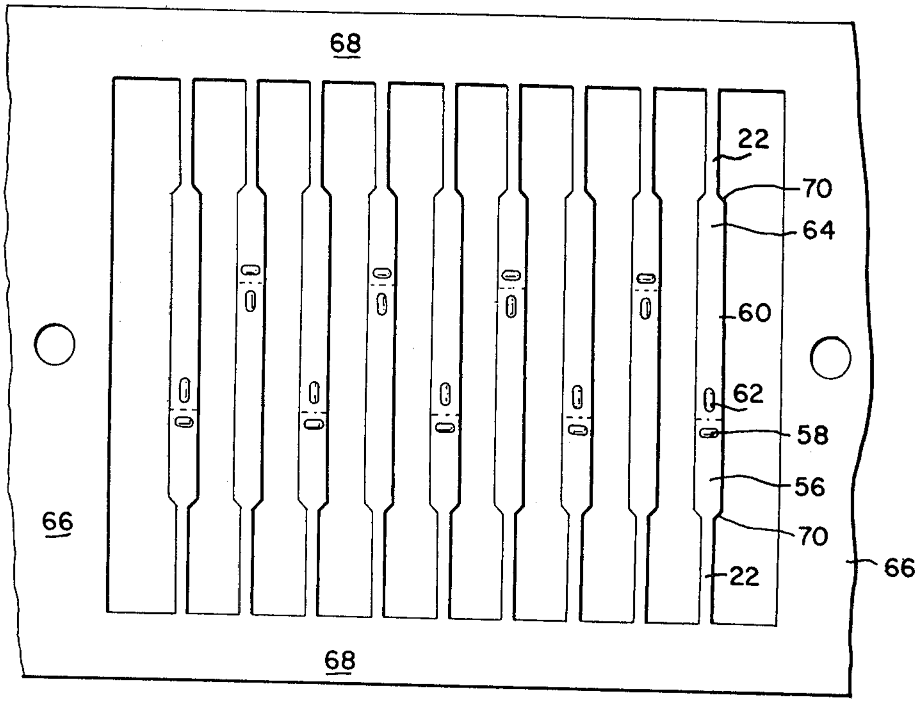
FIG. 3 is a top plan view of a stamped lead frame used in the embodiment of FIG. 1.

An intermediate portion 64 is that part of the contact member between the arm and leg 22. As such, these portions generally include the curved portion of the contact member, and the downwardly depending side to where the width of the contact member is reduced as seen in FIG. 3. As is apparent, there is no attempt here to precisely define or set out a specific "intermediate" portion. Rather, the purpose here is to define a general area of the contact member which is supported by support rails 40 and which separates arms 56–60 from legs 22. As will be seen below and as alluded to above, the three "parts" of a contact member are in fact integral.

FIG. 2 illustrates one complete switch which includes a fixed contact-carrying arm, a movable contact-carrying arm, means for moving the movable arm into contact with the fixed arm, i.e., contact actuator 12 and means for electrically connecting the contacts to circuits; i.e., legs 22.

The lead frame referred to above begins as a roll of conductive material (not shown). The roll may be completely plated or selectively plated at the contact points before being stamped or after, depending upon economics, the stamping and forming process used and other manufacturing techniques. The plating may be gold, tin or some other suitable plating material. Preferably gold is used and is applied to the dimples before the stamping step.

FIG. 3 shows a portion of a roll of plated conductive material after it has been stamped into a flat lead frame. The conventional parts of the frame include the carrier end strips 66 and joining the two end strips are carrier side strips 68. Spanning the side strips are "precut" pairs of contact members. The dash lines show where the cutting will take place to provide the separate, opposing members.

Using the dashed lines as a reference point, the elements of the contact members called out during the discussion of FIG. 2 will be called out again to emphasize the novel simplicity of the present invention and to make the invention even more clear. On the pair of contact members to the far right, and immediately above the dashed line (toward the top of the drawing) dimple 58 on fixed arm 56 is seen extending normal to the axis of the contact member.

As noted above, there is no sharp line of demarcation between fixed arm 56 and intermediate portion 64 immediately above it. However, the thinning of the contact member offers a convenient marker between the intermediate portion and leg 22. More importantly though, the thinning provides lateral beveled shoulders 70 which serve to insure the proper standoff between the electrical switch package and the printed circuit board or the like on which the package is mounted; i.e., the width of the legs are approximately equal to the sizes of openings into which they are inserted; therefore the package can be pushed down onto the board only to where the beveled shoulder abut the board's surface.

With reference to the contact member below the dashed line, dimple 62 on movable arm 60 is seen extending parallel to the axis of the contact member. The remaining functional "parts" of the contact member; i.e., intermediate portion 64, beveled shoulders 70 and leg 22, are also noted.

Figure 4:
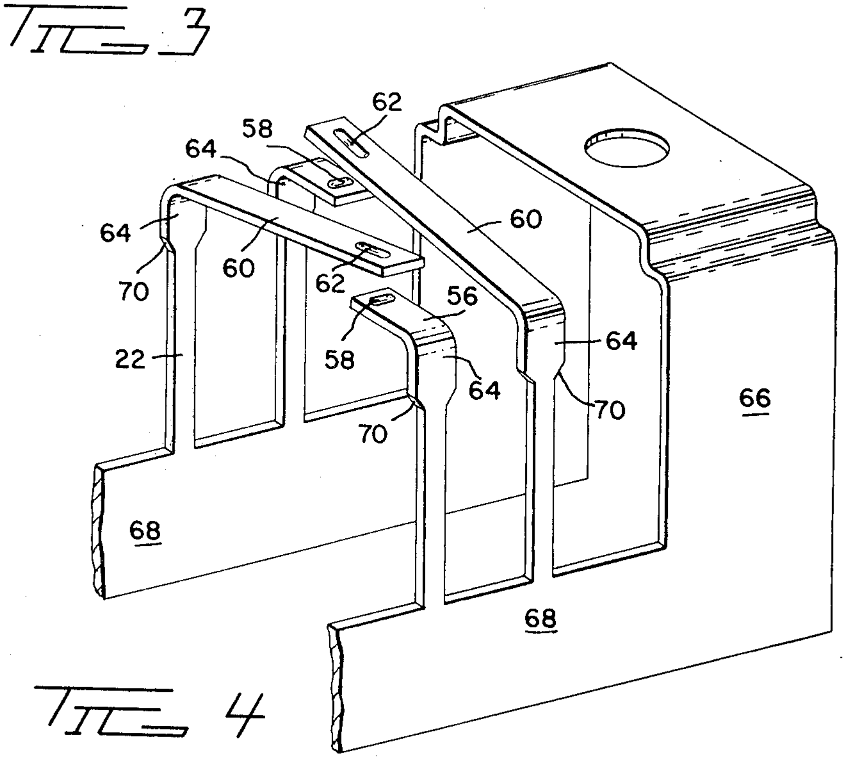
FIG. 4 is a view of the lead frame of FIG. 3 after forming.
Figure 5:
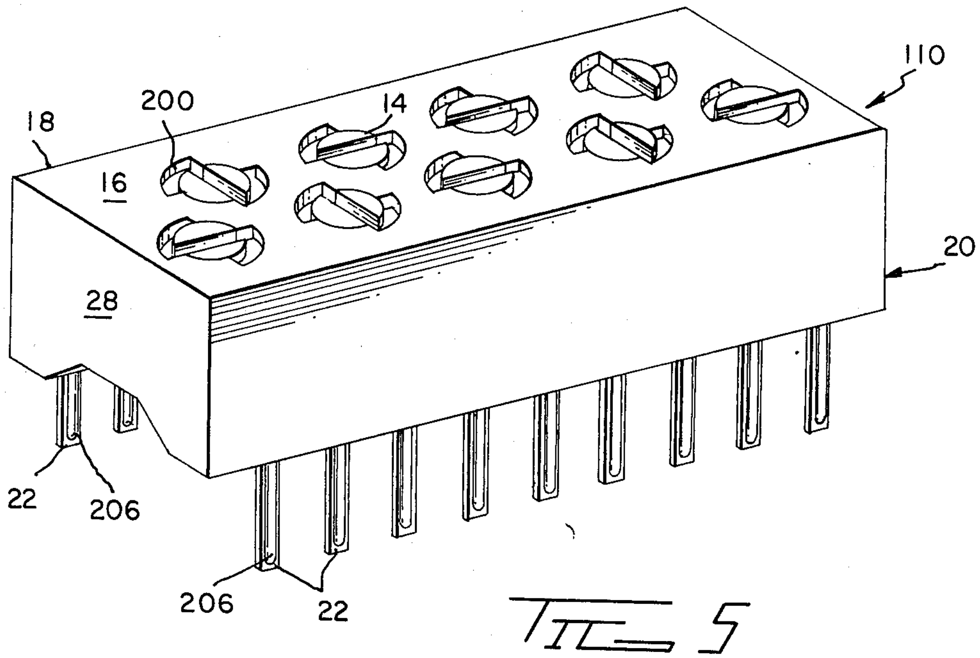
FIG. 5 is a view of the second preferred embodiment constructed in accordance to the present invention.
Figure 6:
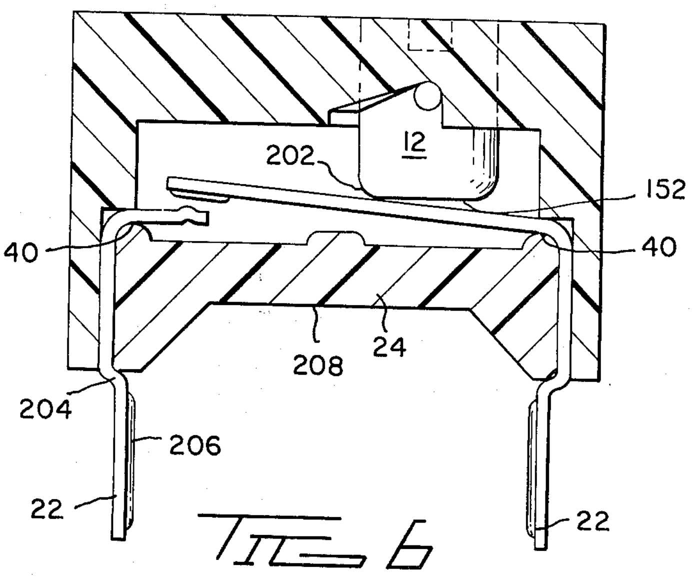
FIG. 6 is a cross-sectional view of the embodiment of FIG. 5.

Before proceeding to the formed frame in FIG. 4, the staggered pattern between pairs of contact members is to be noted. This pattern makes a higher density of switches possible for a given length.

The forming operation bends the lead frame of FIG. 3 into the inverted generally U-shaped frame shown in FIG. 4. Each contact member is bent about 90 degrees in the intermediate portion 64 area. Movable arms 60 are bent upwardly about 30 degrees relative to the horizontal to build a spring force into the arm. Fixed arms 58 remain generally parallel to the horizontal plane or may be bent very slightly upwardly to enhance contact pressure between the contacts.

The forming operation further includes a jogging or off-set operation to reduce the over-all width of the formed frame so that the free end and dimple of movable arm 60 overlaps the free end and dimple of fixed arm 58. The overlap places the two contacts (dimples 58–62) into abutting relation when movable arm 60 is depressed by contact actuator 12.

FIG. 4 shows a partial lead frame as such is representative of an entire frame. Also, the partial frame illustrates the point that the present invention is not limited in the number of switches contained in a package, but can range from one to whatever number is desired.

ASSEMBLY AND OPERATION OF THE FIRST PREFERRED EMBODIMENT

Cover 18 is placed upside down and cam actuators 12, slots 50 facing downwardly, are placed into apertures 14 with pins 54 being received in depressions 38 o.

In one assembly process, the stamped and formed lead frame illustrated in FIG. 4; i.e., with carrier strips 66–68 attached, is inverted and placed into the upside-down cover. Where the package 10 has an odd number of switches, alignment of the frame is automatic; that is, a movable arm 60 will engage the dome-shaped lower surface 52 on actuators 12. On the other hand, care must be taken relative to the proper alignment where the package has an even number of switches.

Base 24, turned over and with adhesive applied to its sides is placed over the lead frames with the vertical parts of the intermediate portions 64 being received in slots 44. Thereafter the carrier strips 66–68 are cut off and the assembly is complete.

An alternative process, and one suitable for a package containing an even number of switches, is one where the lead frame is placed onto the base, and that subassembly placed onto the overturned cover.

The switches of the present invention represent simplicity in operation and versatility. To close a switch; i.e., connect one circuit to another, the appropriate contact actuator 12 is rotated 90 degrees. As pins 54 ride down camming surface 36, the actuator pushes movable arm 60 down. Contacts on the two arms 56–60 meet each other during the downward travel. This engagement halts direct vertical travel of the movable arm at that point; i.e., at the dimple. However, the movable arm spanning cavity 42 continues to be pressed down by the actuator. Thus dimple 62 travels obliquely downward scraping dimple 58 with the result that a wiping action between the two contacts occurs. In this manner, better electrical contact is made.

The portion of travel taking place after the initial contact engagement provides overtravel of the movable arm thereby storing energy therein to compensate for creep or cold flow conditions which may occur in the molded housing. Further, the stored energy causes the movable arm to return to its original position when pressure is removed therefrom. Excessive overtravel of movable arm 60 is prevented by that arm abutting ridge 41.

The arcuate depressions 38 removably lock the actuator and thus the contact members into either an open or closed position. Momentary closing of a switch is available by simply pressing straight down on an actuator 12 and maintaining pressure thereon. Upon release, the spring force in movable arm 60 will break contact engagement and will return the arm and actuator to their open position.

DESCRIPTION OF THE SECOND PREFERRED EMBODIMENT

The electrical switch package of the second preferred embodiment illustrated in FIGS. 5–8, is designated by reference numeral 110. The elements of package 110 are either the same as those in package 10 or have been modified.

The second preferred embodiment is an outgrowth of extensive testing of the first preferred embodiment.

In additional to, or more precisely, as a result of the modifications referred to above, relative dimensions of package 110 differ from those of package 10. For example, in comparing a package 10 with a package 110 where each contains the same number of switch assemblies and are constructed for an identical application, package 110 is slightly wider. These dimensional changes will be expressly noted below.

The top of apertures 14 on cover 18 have been partially enlarged to form diametrically-opposed recesses 200. These recesses offer a stop means to prevent over-rotation of contact actuators 12 provided the head of the screwdriver used has a width greater than slot 50. It is apparent that excessive torquing can shear pins 54 absent such stop means.

Two very significant modifications in package 110 are that the movable arm 60 has been appreciably lengthened and the point of engagement between the contact actuator 12 and movable arm has been moved inwardly to the approximate midpoint on that arm. As an adjunct to the lengthening of the arm, the fixed arm 56 has been shortened and the width of the interior space and housing 20 has been increased.

The relocating of the point of engagement between contact actuator 12 and movable arm 60 to its approximate midpoint without relocating apertures 14 was accomplished by lengthening the actuator and replacing the dome-shaped lower surface 52 with a flat surface 152 having rounded edges 202.

These modifications prevent a concentration of stresses in the intermediate portion of the contact member at rail 40. The stresses resulting from flexing arm 60 are more evenly distributed over the whole length thereof. As contact actuator 12 cams downwardly to close the switch; i.e., open the circuit, arm 60 bows into a symmetrical curve as opposed to the asymmetrical curve obtained in package 10. Whereas both packages perform satisfactorily, material fatigue is lessened by the longer movable arm. Further, an improved recovery of the movable arm is gained as the switch is opened. The contacts separate faster and the arm provides an improved biasing action on the actuator. A click is heard or felt as the arm pushes the pins into depression 38 *o*.

The aforementioned widening of housing 20 increased the distance between legs 22. Thus it was necessary to offset the intermediate portions of the contact members to move the legs back into the required spacing. The offset area is generally designated by the reference numeral 204.

Legs 22 have been made more rigid by impressing elongated dimples 206 along the length thereof.

The height of the housing 20 has been increased and a recess 208 extending down the length of base 24 provided. The recess facilitates washing away excess solder and other residue subsequent to wave soldering the package onto a printed circuit board. The recess further aids in molding by eliminating sink mark and minimizes material consumption.

Another significant modification in package 110 concerns the lead frame and the contact members. As will be recalled, during the forming operation of the lead frame of package 10, an offset operation reduces the over-all width of the frame to achieve overlap of the contacts or dimples on each pair of opposing arms (FIG. 4).

Figure 7:
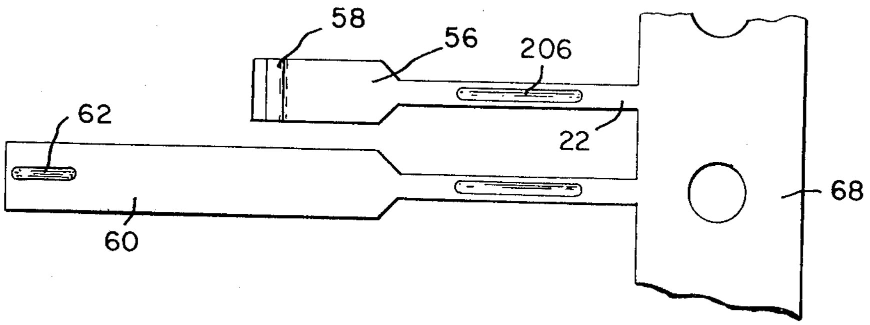
FIG. 7 is a top plan view of the stamped lead frame used in the embodiment of FIG. 5.

In the second preferred embodiment, the lead frame is stamped out as is shown in FIG. 7. There, contact members having alternatingly a fixed arm 56 and then a movable arm 60 extend out from a single carrier side strip 68.

Figure 8:
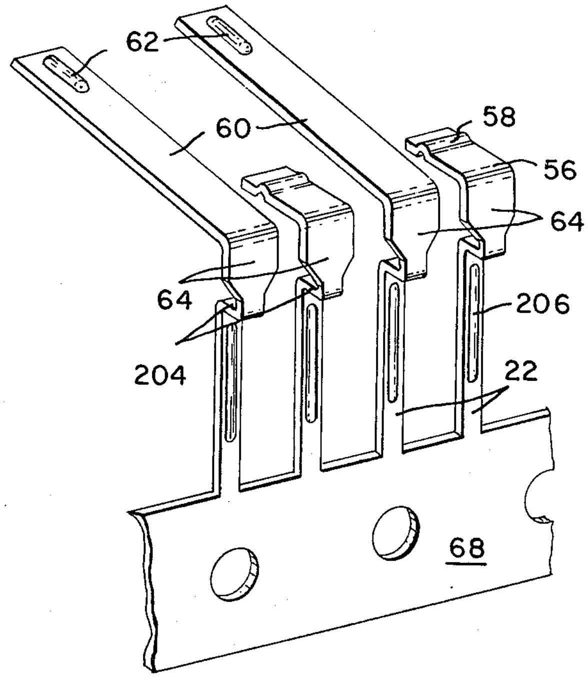
FIG. 8 is a view of the lead frame of FIG. 7 after forming.

Subsequent to the stamping operation, the frame is formed as shown in FIG. 8.

In assembling package 110, two lengths of contact members having the required number for each side are cut from the frame. Each length is placed on a respective side of the base which is then turned over and placed onto the inverted cover. Of course, many other assembly methods can be used.

Preferably the carrier strip 68 remains attached to the contact members until after cover 18 is adhesively or otherwise bonded to base 24.

In summary, the present invention discloses electrical switch packages containing any desired number of individually operated switches. The array of switches, although electrically isolated one from another after assembly in the package, are stamped and formed from a single coplanar sheet of material. Any one switch contains three distinct elements; i.e., the fixed arm contact member, the movable arm contact member and the actuator.

The housing and actuators are economically molded from nylon or like insulating material.

All the elements lend themselves to automatic assembly methods.

The movable arm travel is designed so that energy is stored within to compensate from creep or cold flow conditions occurring in the molded housing and actuators.

The rails and ridge in the base member of the housing serve to prevent overstressing of the movable arm, thereby increasing the useful life of the switches.

Depressions at either end of the camming surfaces removably retain the actuators to prevent accidental opening of closed switches.

Reference to size has been limited to relative statements; e.g., low profile of the package. One reason for not being specific relative to dimensions is that an electrical switch package, constructed in accordance to the present invention, can be made as small or as large as present day manufacturing techniques permit. However, as an example, dimensions for the nine switch package illustrated in FIGS. 1–4 and which is used in conjunction with radio frequency-operated garage and other door openers follow:

| | |
|---|---|
| Overall Height | 0.340 inch |
| Leg Height | 0.140 inch |
| Housing Height | 0.200 inch |
| Overall Width | 0.350 inch |
| Opposing Leg Width | 0.300 inch |
| Overall Length | 1.000 inch |

The dimensions for the nine switch package illustrated in FIGS. 5–8 and used for the same purpose are:

| | |
|---|---|
| Overall Height | 0.400 inch |
| Leg Height | 0.140 inch |
| Housing Height | 0.260 inch |
| Overall Width | 0.380 inch |
| Opposing Leg Width | 0.300 inch |
| Overall Length | 1.000 inch |

These dimensions are given only for purposes of illustration and are not to be construed as limiting the present invention to that size. Further, the detailed description has been given for clearness of understanding only, and no unnecessary limitations should be understood therefrom, as some modifications will be obvious to those skilled in the art.

What is claimed is:

1. A lead frame stamped from a sheet of conductive material adapted for use in an electrical switch package of the type having means therein for pushing one contact into engagement with another contact, which comprises:

a. a frame consisting of integral end carrier strips and side carrier strips;

b. one or more first contact members each containing a contact at the end of an arm of the member, said members extending inwardly from said side carrier strips; and c. one or more second contact members each containing a contact as the end of a arm of the member, said second members being shorter than said arm of acid first members and extending inwardly from said side carrier strips and so positioned such that each second contact member faces a first contact member extending inwardly from the opposing side strip and further, on a same side strip a first contact member is adjacent to a second contact member;

said lead frame being in a U-shaped form with the contact on each first contact member overlapping the contact on the opposing contact member.

2. A lead frame stamped (and formed) from a sheet of conductive material adapted for use in an electrical switch package of the type having means therein for pushing one contact into engagement with another contact, which comprises:

a. a side carrier strip;

b. one or more first contact members integral with and spaced along said strip and extending away therefrom, each containing a contact at the end of an arm of the member; and c. one or more second contact members integral with and spaced along said strip and extending away therefrom parallel to in alternating sequence with said first contact members, each of said second contact members containing a contact at the end of an arm thereof shorter than said arm of said first contact members;

wherein each of said first and second contact members contain a leg with an intermediate portion integral to and positioned between the leg and arm, with said members being formed so that said legs are parallel to but displaced laterally from said intermediate portions.

* * * * *